(12) United States Patent
Jen et al.

(10) Patent No.: US 7,889,009 B2
(45) Date of Patent: Feb. 15, 2011

(54) DISTRIBUTED ACTIVE TRANSFORMER BASED MILLIMETER-WAVE POWER AMPLIFIER CIRCUIT

(75) Inventors: Yung-Nien Jen, Taipei (TW); Jeng-Han Tsai, Taipei (TW); Tian-Wei Huang, Taipei (TW); Huei Wang, Taipei (TW); Che-Yu Wang, Taipei (TW)

(73) Assignee: National Taiwan University, Taipei (TW)

( * ) Notice: Subject to any disclaimer, the term of this patent is extended or adjusted under 35 U.S.C. 154(b) by 0 days.

(21) Appl. No.: 12/481,650

(22) Filed: Jun. 10, 2009

(65) Prior Publication Data

US 2010/0244962 A1   Sep. 30, 2010

(30) Foreign Application Priority Data

Mar. 30, 2009  (TW) .............................. 98110371 A (51) Int. Cl.
  *H03F 3/60* (2006.01)
(52) U.S. Cl. .................... 330/286; 330/276; 330/295
(58) Field of Classification Search ............. 330/165, 330/276, 286, 295, 311
See application file for complete search history.

(56) References Cited

U.S. PATENT DOCUMENTS 6,157,258 A * 12/2000 Adishian et al. ............ 330/276
7,414,478 B2 * 8/2008 Elmala et al. ............... 330/295

OTHER PUBLICATIONS

Jen et al., 2008 Compound Semiconductor Symposium, "A V-band Fully-Integrated CMOS Distributed Active Transformer Power Amplifier for IEEE 802.15.TG3c Wireless Personal Area Network Applications", pp. 1-4 (2008).

* cited by examiner

*Primary Examiner*—Khanh V Nguyen
(74) *Attorney, Agent, or Firm*—Peter F. Corless; Steven M. Jensen; Edwards Angell Palmer & Dodge LLP (57) ABSTRACT

A distributed active transformer (DAT) based millimeter-wave (MMW) power amplifier circuit is designed for power amplification of MMW frequency signals. The proposed MMW power amplifier circuit is characterized by distributing the input frequency signals into two sets of differential signals and by the use of a distributed active transformer circuit unit to process these two sets of differential signals to thereby generate an amplified frequency signal as the end result of output. The invention provides higher and greater added values and power added efficiency (PAE) and is ideal for use in millimeter-wave communications systems with an operation frequency around 60 GHz.

20 Claims, 7 Drawing Sheets

DISTRIBUTED ACTIVE TRANSFORMER BASED MILLIMETER-WAVE POWER AMPLIFIER CIRCUIT

BACKGROUND OF THE INVENTION

1. Field of the Invention

This invention relates to millimeter-wave (MMW) circuit technology, and more particularly, to a distributed active transformer (DAT) based millimeter-wave power amplifier circuit designed for power amplification of MMW frequency signals.

2. Description of Related Art

With the advent of wireless digital communication technologies, such as wireless networking, mobile phones, GPS (Global Positioning System), to name just a few., the design and manufacture of MMW (millimeter wave) signal processing circuitry that handle analog and digital signals within the gigahertz range is in high demand in the electronics industry. Presently, the demand for high-speed MMW signal processing circuitry has advanced to the range from 60 GHz to 77 GHz (gigahertz).

In the design of MMW circuitry, power amplifiers are an essential circuit component that is used for power amplification of MMW frequency signals. In order to achieve and offer high-speed performance, the design of MMW power amplifiers requires the capability of providing a constant gain across a broad bandwidth. In addition, since most of MMW signal processing circuits are to be utilized on portable electronic devices such as mobile phones, the MMW circuit design also requires the capability of low power consumption and compactness in size.

Presently, there are a great variety of conventional MMW power amplifiers which can be fabricated by various integrated circuit technologies such as SiGe 0.13 µm (millimeter) BiCMOS, SiGe 0.118 µm BiCMOS, and CMOS 90 nm (nanometer) fabrication technologies. In design, MMW power amplifiers are widely constructed on DAT (distributed active transformer) circuitry, cascode circuitry, and multiple-stage circuitry. However, these conventional MMW power amplifiers are still unable to provide satisfactory amplification gains and saturated power levels. Therefore, there still exists a need in the electronic industry for new and improved MMW power amplifier circuits that can provide better performance over the conventional technologies.

SUMMARY OF THE INVENTION

It is therefore an objective of the present invention to provide a distributed active transformer based millimeter-wave power amplifier circuit which is capable of power amplification of MMW frequency signals around 60 GHz with a broad bandwidth and also can provide the capability of low power consumption and compactness in size.

To achieve the above objective, the present invention provides A distributed active transformer based millimeter-wave power amplifier circuit for power amplification of an input frequency signal, which the power amplifier comprises: a driver amplifier array circuit unit for amplification and splitting of the input frequency signal into at least two amplified signals including a first amplified signal and a second amplified signal; a transformer array circuit unit for reception and processing of the first amplified signal and the second amplified signal output from the driver amplifier array circuit unit through an electromagnetic induction effect to thereby convert the first amplified signal into a first pair of differential signals including a first positive differential signal and a first negative differential signal, and meanwhile to thereby convert the second amplified signal into a second pair of differential signals including a second positive differential signal and a second negative differential signal; a power amplifier array circuit unit for reception and power amplification of the first positive differential signal, the first negative differential signal, the second positive differential signal, and the second negative differential signal output from the transformer array circuit unit to thereby correspondingly produce a first amplified positive differential signal, a first amplified negative differential signal, a second amplified positive differential signal, and a second amplified negative differential signal; and a distributed active transformer circuit unit for reception and distributed active power transformation of the first amplified positive differential signal, the first amplified negative differential signal, the second amplified positive differential signal, and the second amplified negative differential signal output from the power amplifier array circuit unit, to thereby produce a transformed signal for use as an output frequency signal.

The present invention also provides a distributed active transformer based millimeter-wave power amplifier circuit for power amplification of an input frequency signal, which the power amplifier circuit comprises: a driver amplifier array circuit unit, which is composed of a plurality of cascode driver amplifiers, for amplification and splitting of the input frequency signal into at least two amplified signals including a first amplified signal and a second amplified signal; a transformer array circuit unit for reception and processing of the first amplified signal and the second amplified signal output from the driver amplifier array circuit unit through an electromagnetic induction effect to thereby convert the first amplified signal into a first pair of differential signals including a first positive differential signal and a first negative differential signal, and meanwhile to thereby convert the second amplified signal into a second pair of differential signals including a second positive differential signal and a second negative differential signal; a power amplifier array circuit unit, which is composed of the plurality of cascode power amplifiers, for reception and power amplification of the first positive differential signal, the first negative differential signal, the second positive differential signal, and the second negative differential signal output from the transformer array circuit unit to thereby correspondingly produce a first amplified positive differential signal, a first amplified negative differential signal, a second amplified positive differential signal, and a second amplified negative differential signal; and a distributed active transformer circuit unit for reception and distributed active power transformation of the first amplified positive differential signal, the first amplified negative differential signal, the second amplified positive differential signal, and the second amplified negative differential signal output from the power amplifier array circuit unit, to thereby produce a transformed signal for use as an output frequency signal.

In the circuit architecture, the distributed active transformer based millimeter-wave power amplifier circuit according to the invention comprises: (A) a driver amplifier array circuit unit; (B) a transformer array circuit unit; (C) a power amplifier array circuit unit; and (D) a distributed active transformer (DAT) circuit unit.

The DAT-based MMW power amplifier circuit of the invention is characterized by distributing the input frequency signals into two sets of differential signals and by the use of the DAT circuit unit to process these two sets of differential signals to thereby generate an amplified frequency signal as the end result of output. The invention provides higher and greater added values and power added efficiency (PAE) and is ideal for use in millimeter-wave communications systems with an operation frequency around 60 GHz.

BRIEF DESCRIPTION OF DRAWINGS

The present invention can be more fully understood by reading the following detailed description of the preferred embodiments, with reference made to the accompanying drawings, wherein:

FIG. 5 is a schematic diagram showing an example of a circuit layout scheme used for IC implementation of the DAT circuit unit utilized by the invention for;

DETAILED DESCRIPTION OF PREFERRED EMBODIMENTS

The distributed active transformer based millimeter-wave power amplifier circuit according to the invention is disclosed in full details by way of preferred embodiments in the following with reference to the accompanying drawings.

Function of the Invention

Figure 1:
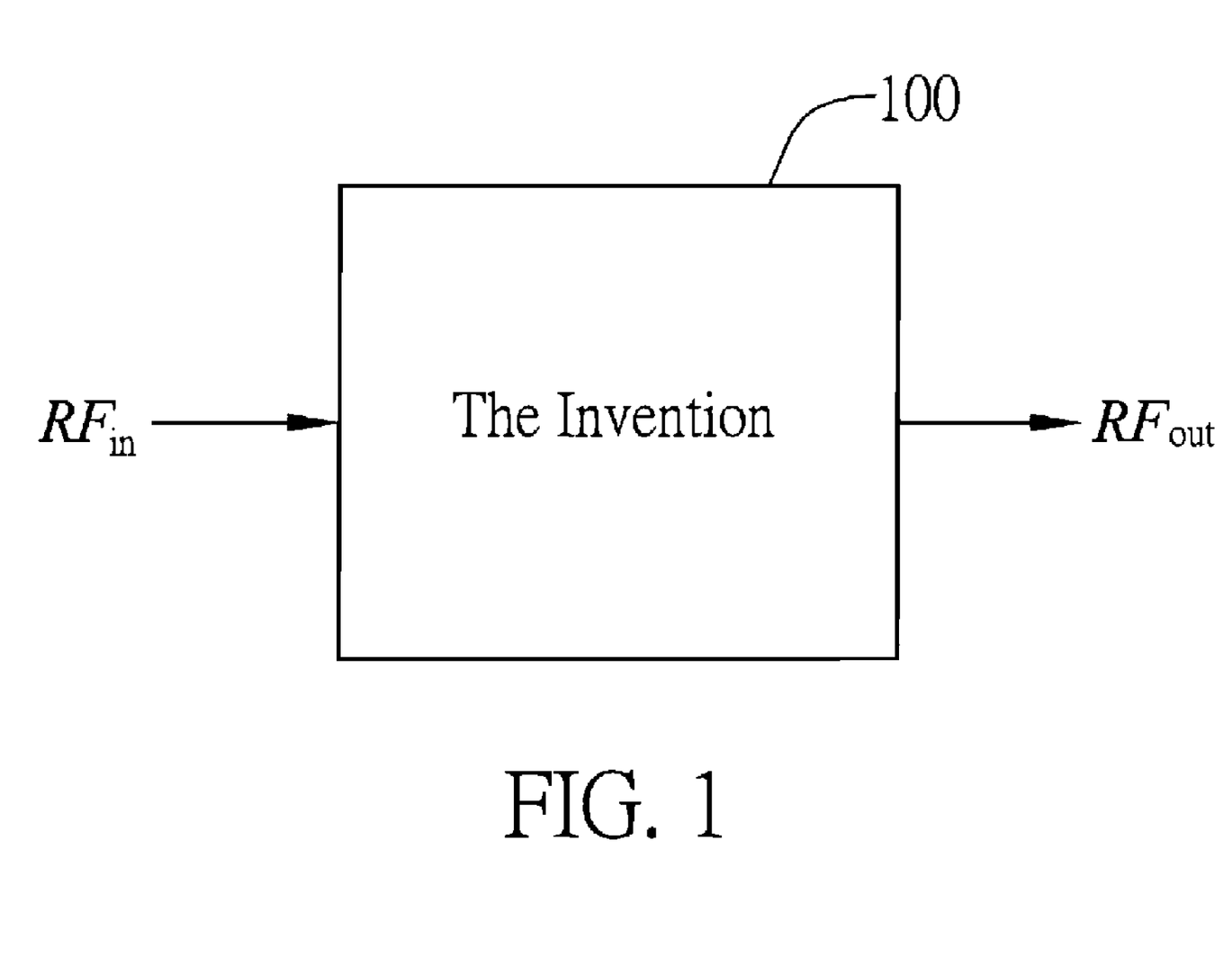
FIG. 1 is a schematic diagram showing the I/O functional model of the DAT-based MMW power amplifier circuit of the invention.

FIG. 1 shows the I/O (input/output) functional model of the distributed active transformer (DAT) based millimeter-wave (MMW) power amplifier circuit of the invention (which is here encapsulated in a box indicated by the reference numeral 100 and will be hereinafter referred to in short as "MMW power amplifier circuit"). As shown, the MMW power amplifier circuit of the invention 100 is used for processing an input frequency signal $RF_{in}$ (i.e., an MMW frequency signal) that is received at its input port, for amplifying the input frequency signal $Rf_{in}$ and outputting the amplified signal as the end result of output (the output frequency signal $RF_{out}$) at its output port. In practical applications, the input frequency signal $RF_{in}$ can have a frequency within the bandwidth of from 55 GHz to 71 GHz (gigahertz).

Architecture of the Invention

Figure 2:
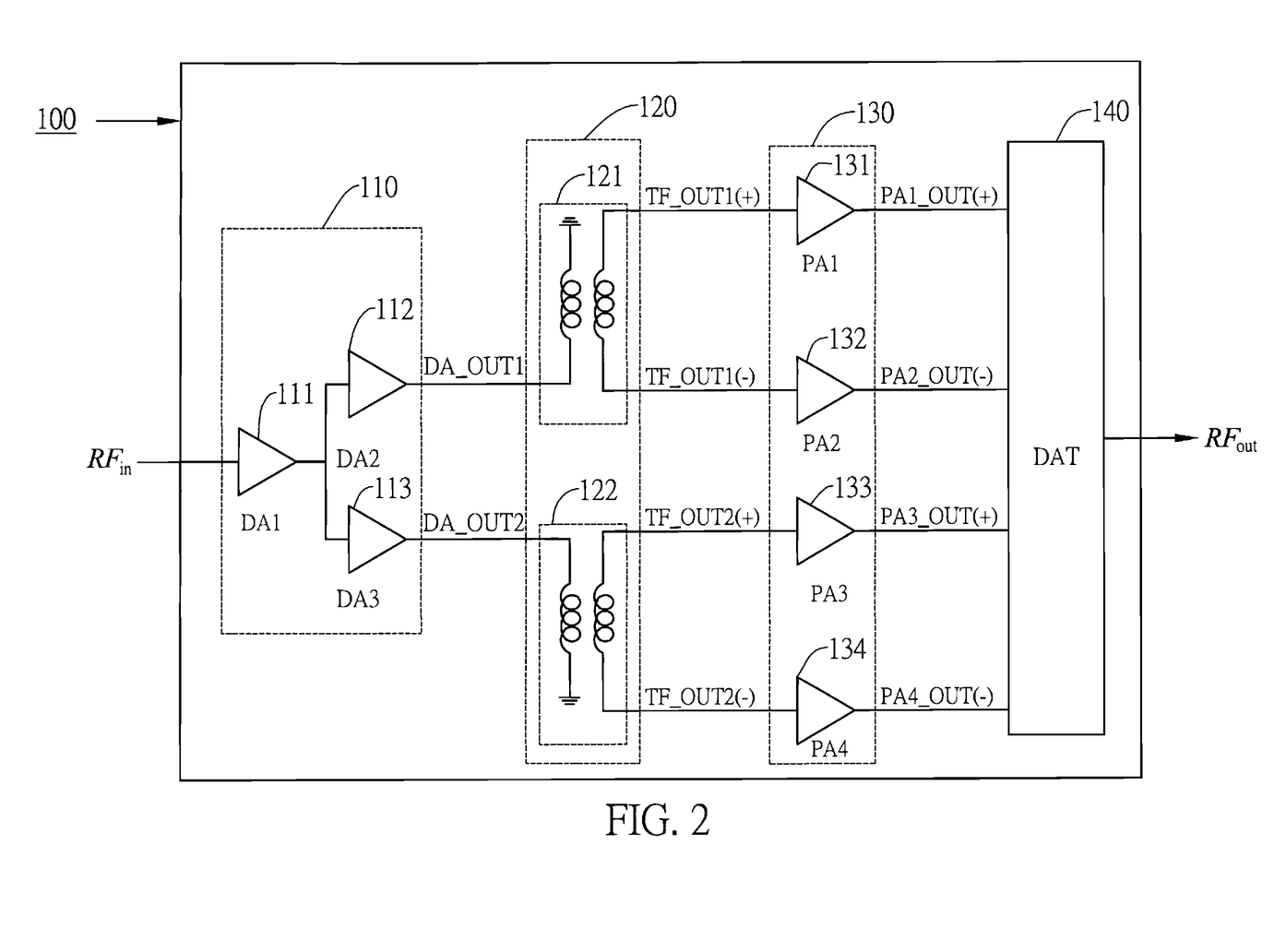
FIG. 2 is a schematic diagram showing the circuit architecture of the DAT-based MMW power amplifier circuit of the invention.

As shown in FIG. 2, in circuit architecture, the MMW power amplifier circuit of the invention 100 comprises: (A) a driver amplifier array circuit unit 110; (B) a transformer array circuit unit 120; (C) a power amplifier array circuit unit 130; and (D) a distributed active transformer circuit unit 140. Firstly, the respective attributes and functions of these constituent circuit components of the invention are described in details in the following (A) Driver Amplifier (DA) Array Circuit Unit 110

In operation according to an embodiment, the driver amplifier array circuit unit 110 is used for amplification and splitting of the input frequency signal $RF_{in}$ into two amplified signals for use as a pair of output signals which are respectively denoted as a first amplified signal DA_OUT1 and a second amplified signal DA_OUT2.

In an embodiment, the driver amplifier array circuit unit 110 is preferably implemented with three driver amplifiers (DA), including a first driver amplifier (DA1) 111, a second driver amplifier (DA2) 112, and a third driver amplifier (DA3) 113. In circuit assembly, the first driver amplifier (DA1) 111 has its input end connected for reception of the input frequency signal $RF_{in}$ and its output end connected to both the input end of the second driver amplifier (DA2) 112 and the input end of the third driver amplifier (DA3) 113. This circuit arrangement splits $RF_{in}$ into two branched signals which are subsequently amplified by the second driver amplifier (DA2) 112 and the third driver amplifier (DA3) 113 respectively to produce the two output signals DA_OUT1 and DA_OUT2. In this circuit assembly, the first driver amplifier (DA1) 111 constitutes a first amplification stage, while the second driver amplifier (DA2) 112 and the second driver amplifier (DA2) 112 in combination constitute a second amplification stage for splitting and amplifying the output of the first amplification stage into two amplified signals.

Figure 3:
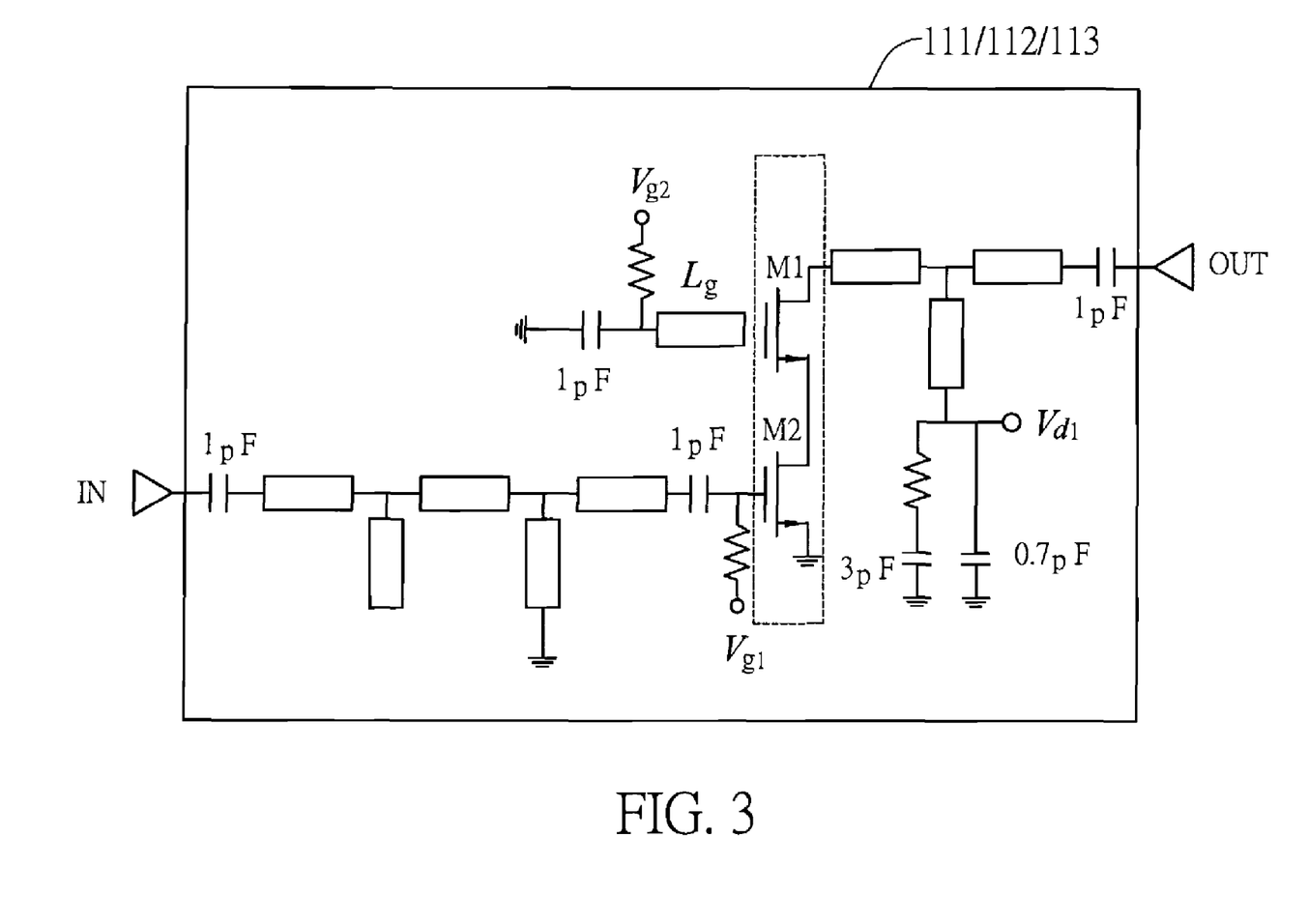
FIG. 3 is a schematic diagram showing an example of the internal architecture of each of the driver amplifiers utilized by the invention for realizing a driver amplifier array circuit unit.

In an embodiment, for example, the above-mentioned 3 driver amplifiers (DA1, DA2, DA3) 111, 112, 113 can be realized by using a cascode transistor-based circuit architecture which is composed of a pair of transistors (M1, M2) connected in a cascode manner. In this circuit diagram, the input port is represented by IN while the output port is represented by OUT. The use of this cascode circuit architecture allows the provision of a higher amplification gain and a higher breakdown voltage.

(B) Transformer Array Circuit Unit 120

In an embodiment, the transformer array circuit unit 120 is used for reception of the paired output signals (DA_OUT1, DA_OUT2) from the driver amplifier array circuit unit 110 and processing these two signals by means of electromagnetic induction to thereby produce two pairs of differential signals, i.e., the first amplified signal DA_OUT1 is transformed into a first pair of differential signals including a first positive differential signal TF_OUT1(+) and a first negative differential signal TF_OUT1(−), while the second amplified signal DA_OUT2 is transformed into a second pair of differential signals including a second positive differential signal TF_OUT2(+) and a second negative differential signal TF_OUT2(−).

In an embodiment, the transformer array circuit unit 120 is preferably implemented with two transformers, including a first transformer 121 and a second transformer 122, each of which has two input ports (a positive input port and a negative input port) and two output ports (a positive output port and a negative output port). In circuit assembly, the first transformer 121 has its positive input port connected to the output port of the second driver amplifier (DA2) 112 and has its negative input port connected to a grounding point GND; while the second transformer 122 has its positive input port connected to the output port of the third driver amplifier (DA3) 113 and has its negative input port connected to the grounding point GND.

In actual operation according to the embodiment, the first transformer 121 operates to output the first positive differential signal TF_OUT1(+) at its positive output port and the first negative differential signal TF_OUT1(−) at its negative output port. Besides, the second transformer 122 operates to output the second positive differential signal TF_OUT2(+) at its positive output port and the second negative differential signal TF_OUT2(−) at its negative output port.

(C) Power Amplifier Array Circuit Unit 130

In an embodiment, the power amplifier array circuit unit 130 is used for reception of the above-mentioned two groups of paired differential signals [TF_OUT1(+),TF_OUT1(−)] and [TF_OUT2(+),TF_OUT2(−)] from the transformer array circuit unit 120 and amplifying these signals to thereby produce a first amplified positive differential signal PA1_OUT1(+), a first amplified negative differential signal PA1_OUT1(−), a second amplified positive differential signal PA2_OUT1(+), and a second amplified negative differential signal PA2_OUT1(−).

Figure 4:
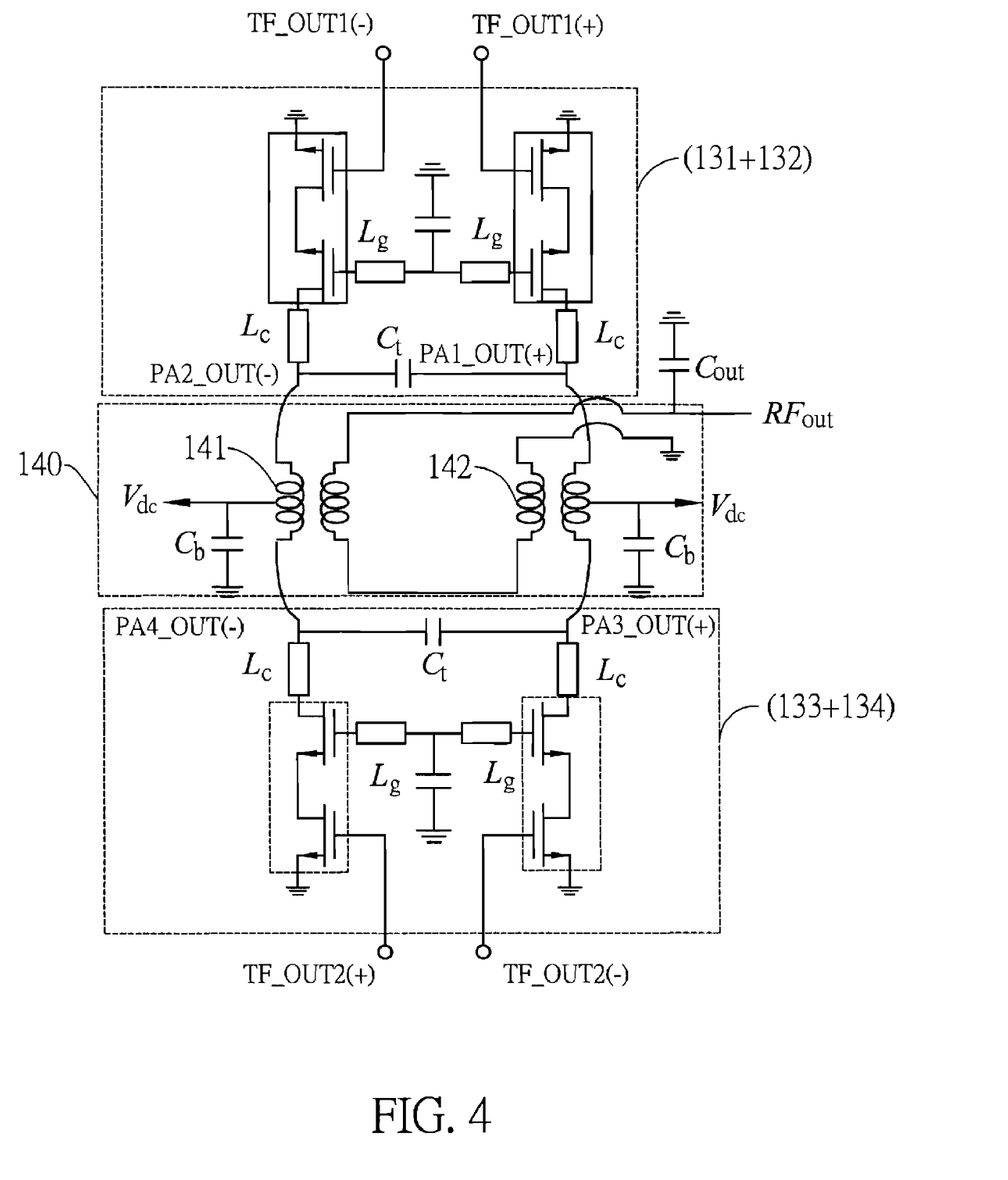
FIG. 4 is a schematic diagram showing an example of the internal architecture of the combined circuitry of a power amplifier array circuit unit and a DAT circuit unit utilized by the invention.

In an embodiment, the power amplifier array circuit unit 130 is preferably implemented with four power amplifiers, including a first power amplifier (PA1) 131, a second power amplifier (PA2) 132, a third power amplifier (PA3) 133, and a fourth power amplifier (PA4) 134. In circuit assembly, the first power amplifier (PA1) 131 has its input end connected to the first output end TF_OUT1(+) of the transformer array circuit unit 120; the second power amplifier (PA2) 132 has its input end connected to the second output end TF_OUT1(−) of the transformer array circuit unit 120; the third power amplifier (PA3) 133 has its input end connected to the first output end TF_OUT2(+) of the transformer array circuit unit 120; and the fourth power amplifier (PA4) 134 has its input end connected to the second output end TF_OUT2(−) of the transformer array circuit unit 120. In actual implementation, as illustrated in FIG. 4, the above-mentioned 4 power amplifiers (PA1, PA2, PA3, PA4) can be realized by using a cascode circuit architecture which is composed of a pair of transistors.

(D) Distributed Active Transformer Circuit Unit 140

Figure 5:
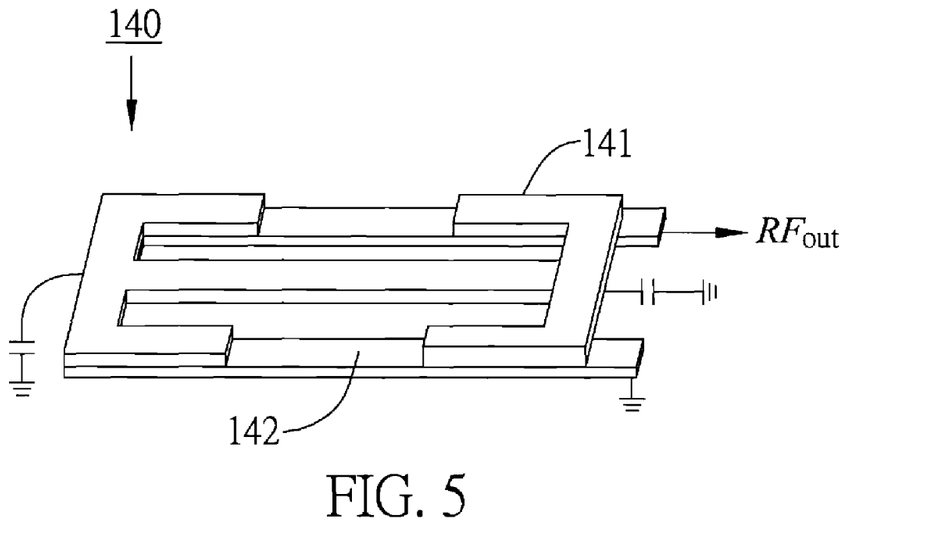

In operation according to an embodiment, the DAT circuit unit 140 is used for reception of the above-mentioned four amplified output signals [PA1(+), PA2(−), PA3(+), PA4(−)] from the power amplifier array circuit unit 130, for distributed active transformation of these four signals to thereby produce the output frequency signal $RF_{out}$. FIG. 4 shows the equivalent circuit of this DAT circuit unit 140. Further, FIG. 5 shows an example of the circuit layout of this DAT circuit unit 140 in IC (integrated circuit) implementation, which includes a primary coil 141 and a secondary coil 142. In circuit layout, the primary coil 141 is connected in a distributed manner to all the output ends of the power amplifiers of the power amplifier array circuit unit 130, while the secondary coil 142 is inductively coupled to the primary coil 141 such that the voltage at the primary coil 141 can cause the secondary coil 142 to produce an induced voltage to serve as the amplified output signal.

Figure 6A:
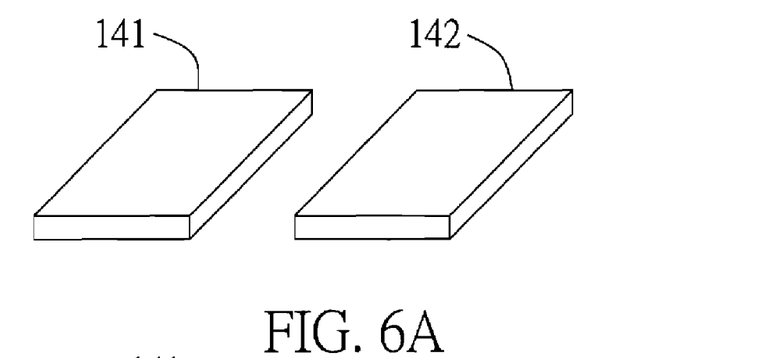
FIG. 6A is a signal diagram showing an edge-coupling architecture utilized by the invention for implementation of the DAT circuit unit.
Figure 6B:
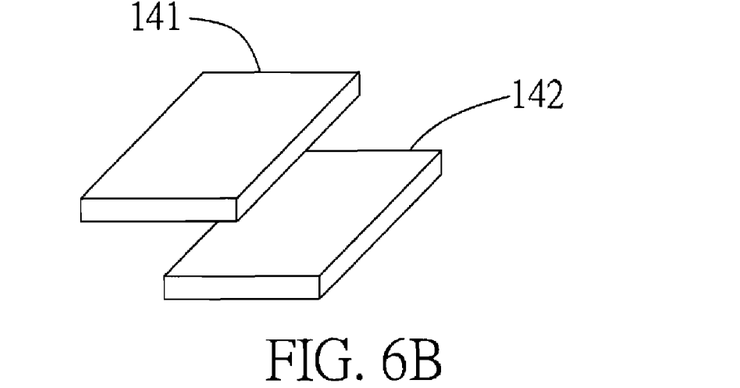
FIG. 6B is a signal diagram showing a broadside-coupling architecture utilized by the invention for implementation of the DAT circuit unit.

In one preferred embodiment of the invention, the inductive coupling between the primary coil 141 and the secondary coil 142 can be based either on an edging coupling architecture as illustrated in FIG. 6A or on a broadside coupling architecture as illustrated in FIG. 6B.

Operating Characteristics of the Invention

Figure 7A:
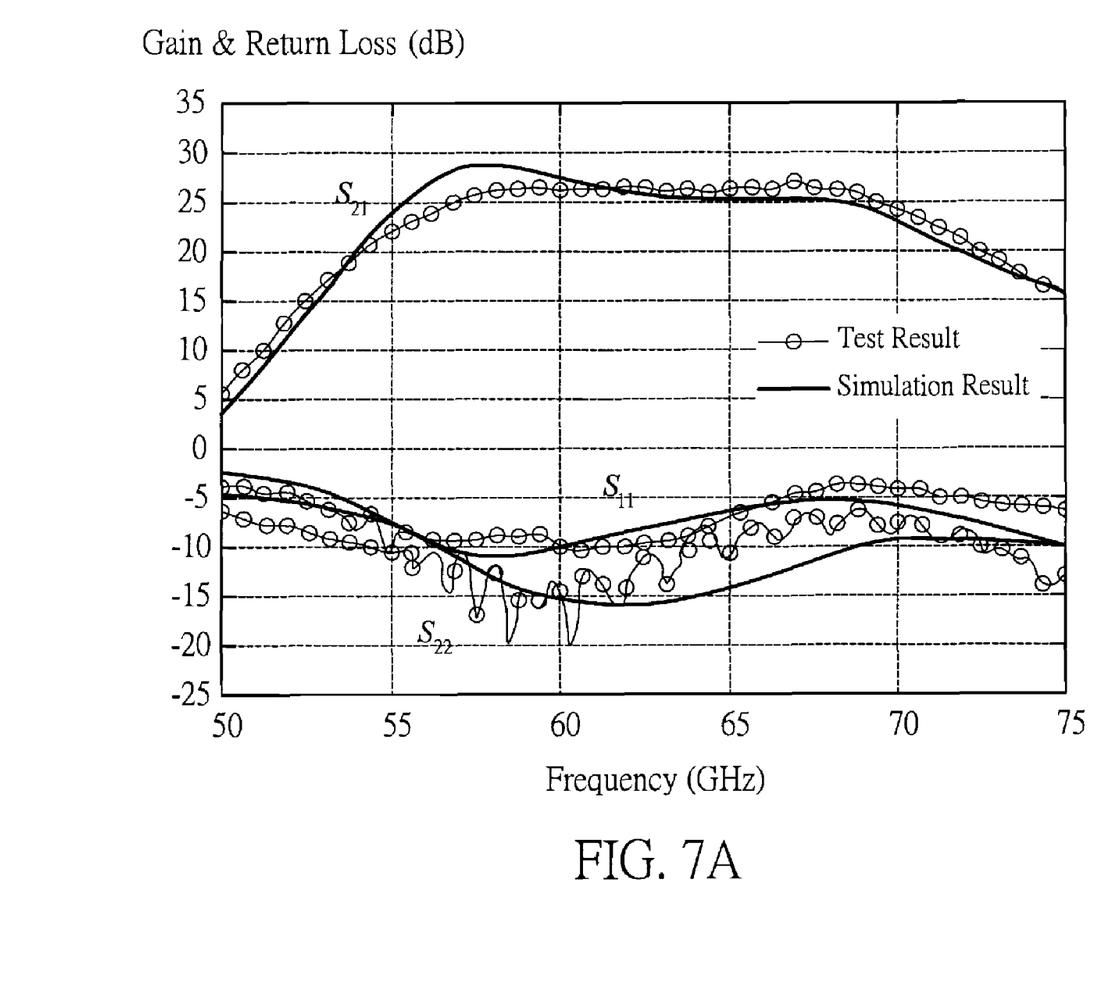
FIG. 7A is a graph showing the gain-versus-frequency characteristic of the DAT-based MMW power amplifier circuit of the invention.

FIG. 7A is a graph showing the gain-versus-frequency characteristic of the MMW power amplifier circuit of the invention 100. It can be seen from this graph that within the bandwidth of from 55 GHz to 71 GHz, the simulation result reveals a promising amplification gain of approximately 26±1.5 dB.

Figure 7B:
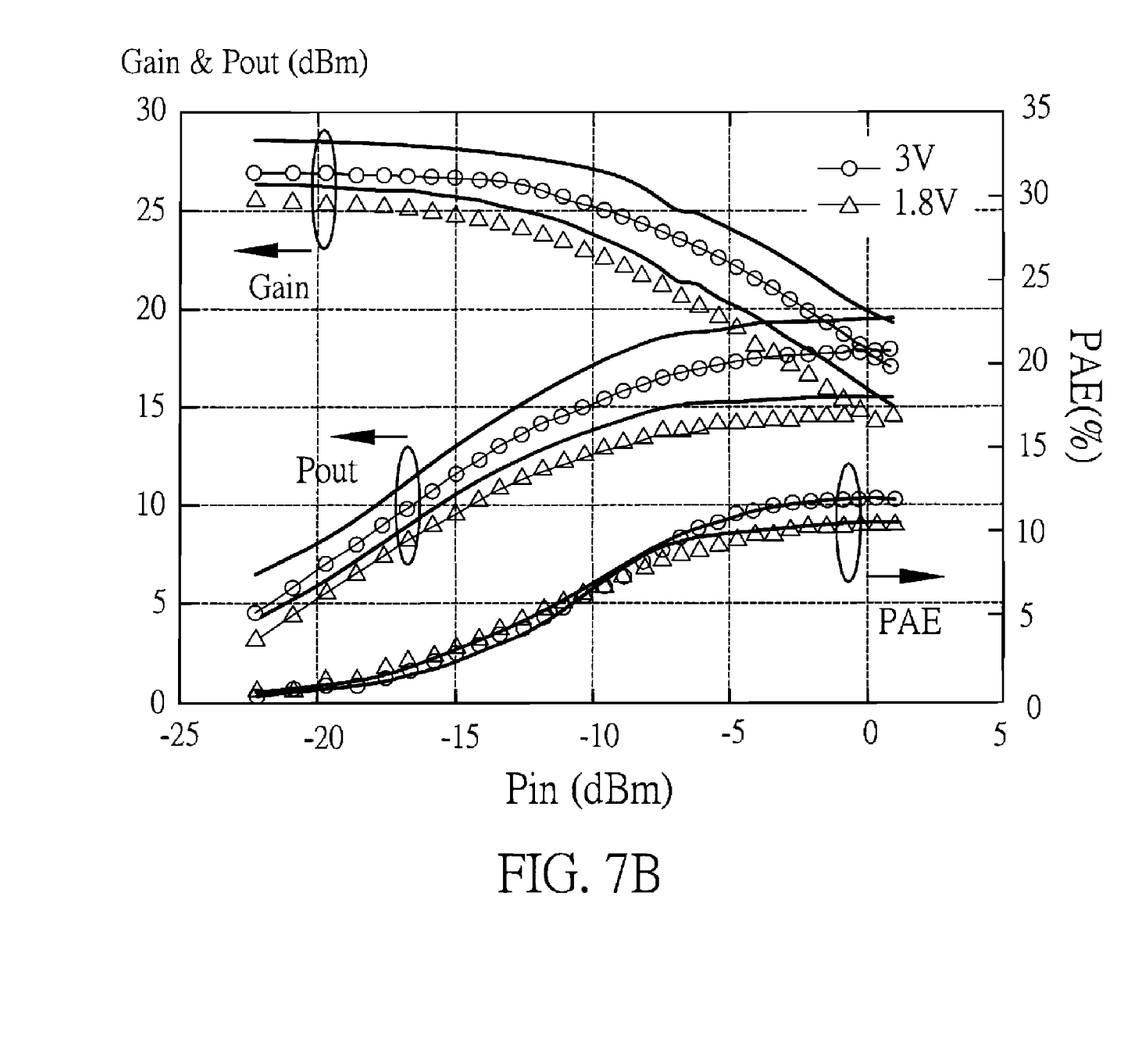
FIG. 7B is a graph showing the gain and output power versus input power characteristic of the DAT-based MMW power amplifier circuit of the invention.

Further, FIG. 7B is a graph showing the gain and output power ($P_{out}$) versus input power ($P_{in}$) characteristic of the MMW power amplifier circuit of the invention 100. It can be seen from this graph that at the frequency of 60 GHz, the invention can provide a PAE (power added efficiency) of approximately 10.2% under an operating voltage of 1.8 V (volt), and a PAE of approximately 12.2% under an operating voltage of 12.2 V.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A distributed active transformer based millimeter-wave power amplifier circuit for power amplification of an input frequency signal, which the power amplifier circuit comprises:

a driver amplifier array circuit unit for amplification and splitting of the input frequency signal into at least two amplified signals including a first amplified signal and a second amplified signal;

a transformer array circuit unit for reception and processing of the first amplified signal and the second amplified signal output from the driver amplifier array circuit unit through an electromagnetic induction effect to thereby convert the first amplified signal into a first pair of differential signals including a first positive differential signal and a first negative differential signal, and meanwhile to thereby convert the second amplified signal into a second pair of differential signals including a second positive differential signal and a second negative differential signal;

a power amplifier array circuit unit for reception and power amplification of the first positive differential signal, the first negative differential signal, the second positive differential signal, and the second negative differential signal output from the transformer array circuit unit to thereby correspondingly produce a first amplified positive differential signal, a first amplified negative differential signal, a second amplified positive differential signal, and a second amplified negative differential signal; and a distributed active transformer circuit unit for reception and distributed active power transformation of the first amplified positive differential signal, the first amplified negative differential signal, the second amplified positive differential signal, and the second amplified negative differential signal output from the power amplifier array circuit unit, to thereby produce a transformed signal for use as an output frequency signal.

2. The distributed active transformer based millimeter-wave power amplifier circuit of claim 1, wherein the input frequency signal has a bandwidth ranging from 55 GHz to 71 GHz.

3. The distributed active transformer based millimeter-wave power amplifier circuit of claim 1, wherein the driver amplifier array circuit unit includes:
- a first driver amplifier having a first input end and a first output end, and the first input end is used for reception of the input frequency signal;
- a second driver amplifier having a second input end and a second output end, and the second input end is connected to the first output end of the first driver amplifier, while the second output end is used for outputting the first amplified signal; and
- a third driver amplifier having a third input end and a third output end, and the third input end is connected to the first output end of the first driver amplifier, while the third output end is used for outputting the second amplified signal.

4. The distributed active transformer based millimeter-wave power amplifier circuit of claim 3, wherein the first driver amplifier is a cascode transistor-based circuit.

5. The distributed active transformer based millimeter-wave power amplifier circuit of claim 3, wherein the second driver amplifier is a cascode transistor-based circuit.

6. The distributed active transformer based millimeter-wave power amplifier circuit of claim 3, wherein the third driver amplifier is a cascode transistor-based circuit.

7. The distributed active transformer based millimeter-wave power amplifier circuit of claim 1, wherein the power amplifier array circuit unit includes:
- a first power amplifier for reception of the first positive differential signal to thereby produce and output the first amplified positive differential signal;
- a second power amplifier for reception of the first negative differential signal to thereby produce and output the first amplified negative differential signal;
- a third power amplifier for reception of the second positive differential signal to thereby produce and output the second amplified positive differential signal; and
- a fourth power amplifier for reception of the second negative differential signal to thereby produce and output the second amplified negative differential signal.

8. The distributed active transformer based millimeter-wave power amplifier circuit of claim 7, wherein the first power amplifier is a cascode transistor-based circuit architecture.

9. The distributed active transformer based millimeter-wave power amplifier circuit of claim 7, wherein the second power amplifier is a cascode transistor-based circuit architecture.

10. The distributed active transformer based millimeter-wave power amplifier circuit of claim 7, wherein the third power amplifier is a cascode transistor-based circuit architecture.

11. The distributed active transformer based millimeter-wave power amplifier circuit of claim 7, wherein the fourth power amplifier is a cascode transistor-based circuit architecture.

12. The distributed active transformer based millimeter-wave power amplifier circuit of claim 1, wherein the distributed active transformer circuit unit includes:
- a primary coil which is connected in a distributed manner to an output end of each of power amplifiers in the power amplifier array circuit unit; and
- a secondary coil which is inductively coupled to the primary coil such that a voltage at the primary coil can cause the secondary coil to produce an induced voltage to serve as the amplified output signal.

13. The distributed active transformer based millimeter-wave power amplifier circuit of claim 12, wherein the secondary coil is inductively coupled to the primary coil by means of an edge-coupling architecture.

14. The distributed active transformer based millimeter-wave power amplifier circuit of claim 12, wherein the secondary coil is inductively coupled to the primary coil by means of a broadside-coupling architecture.

15. The distributed active transformer based millimeter-wave power amplifier circuit of claim 1, whose fabrication is implemented with a 90 nanometer CMOS fabrication process.

16. A distributed active transformer based millimeter-wave power amplifier circuit for power amplification of an input frequency signal, which the power amplifier circuit comprises:
- a driver amplifier array circuit unit, which is composed of a plurality of cascode driver amplifiers, for amplification and splitting of the input frequency signal into at least two amplified signals including a first amplified signal and a second amplified signal;
- a transformer array circuit unit for reception and processing of the first amplified signal and the second amplified signal output from the driver amplifier array circuit unit through an electromagnetic induction effect to thereby convert the first amplified signal into a first pair of differential signals including a first positive differential signal and a first negative differential signal, and meanwhile to thereby convert the second amplified signal into a second pair of differential signals including a second positive differential signal and a second negative differential signal;
- a power amplifier array circuit unit, which is composed of the plurality of cascode power amplifiers, for reception and power amplification of the first positive differential signal, the first negative differential signal, the second positive differential signal, and the second negative differential signal output from the transformer array circuit unit to thereby correspondingly produce a first amplified positive differential signal, a first amplified negative differential signal, a second amplified positive differential signal, and a second amplified negative differential signal; and
- a distributed active transformer circuit unit for reception and distributed active power transformation of the first amplified positive differential signal, the first amplified negative differential signal, the second amplified positive differential signal, and the second amplified negative differential signal output from the power amplifier array circuit unit, to thereby produce a transformed signal for use as an output frequency signal.

17. The distributed active transformer based millimeter-wave power amplifier circuit of claim 16, wherein the input frequency signal has a bandwidth ranging from 55 GHz to 71 GHz.

18. The distributed active transformer based millimeter-wave power amplifier circuit of claim 16, wherein the distributed active transformer circuit unit includes:
- a primary coil which is connected in a distributed manner to the output end of each of the power amplifiers in the power amplifier array circuit unit; and
- a secondary coil which is inductively coupled to the primary coil such that a voltage at the primary coil can cause the secondary coil to produce an induced voltage to thereby serve as the amplified output signal.

19. The distributed active transformer based millimeter-wave power amplifier circuit of claim 18, wherein the secondary coil is inductively coupled to the primary coil by means of an edge-coupling architecture.

20. The distributed active transformer based millimeter-wave power amplifier circuit of claim 18, wherein the secondary coil is inductively coupled to the primary coil by means of a broadside-coupling architecture.

* * * * *